United States Patent
Milo et al.

(10) Patent No.: US 10,573,583 B2
(45) Date of Patent: Feb. 25, 2020

(54) SEMICONDUCTOR DEVICE PACKAGE WITH GROOVED SUBSTRATE

(71) Applicant: Texas Instruments Incorporated, Dallas, TX (US)

(72) Inventors: Dolores Babaran Milo, Baguio (PH); Cherry Lyn Marquez Aranas, Pampanga (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/013,753

(22) Filed: Jun. 20, 2018

(65) Prior Publication Data

US 2019/0393138 A1 Dec. 26, 2019

(51) Int. Cl.
*H01L 23/495* (2006.01)
*H01L 23/31* (2006.01)
*H01L 21/56* (2006.01)
*H01L 23/00* (2006.01)
*H01L 21/48* (2006.01)

(52) U.S. Cl.
CPC .... *H01L 23/49541* (2013.01); *H01L 21/4842* (2013.01); *H01L 21/56* (2013.01); *H01L 23/3107* (2013.01); *H01L 23/49582* (2013.01); *H01L 24/16* (2013.01); *H01L 2224/16245* (2013.01)

(58) Field of Classification Search
CPC ......... H01L 23/49541; H01L 23/49582; H01L 23/3107; H01L 21/4842; H01L 21/56; H01L 24/16

USPC .......................................................... 257/667
See application file for complete search history.

(56) References Cited

U.S. PATENT DOCUMENTS

| | | | |
|---|---|---|---|
| 8,536,689 B2* | 9/2013 | Dimaano, Jr. | H01L 23/3107 257/666 |
| 10,217,712 B2* | 2/2019 | Lu | H01L 23/13 |
| 2017/0372997 A1* | 12/2017 | Tsukamoto | H01L 23/3128 |
| 2019/0139845 A1* | 5/2019 | Lin | H01L 21/565 |
| 2019/0287918 A1* | 9/2019 | Kim | H01L 21/4842 |

* cited by examiner

*Primary Examiner* — Dao H Nguyen
(74) *Attorney, Agent, or Firm* — Dawn Jos; Charles A. Brill; Frank D. Cimino

(57) ABSTRACT

In a described example, a method for making a packaged semiconductor device includes laser ablating a first groove with a first width and a first depth into a mounting surface of a substrate between landing pads. A first pillar bump on an active surface of a semiconductor device is bonded to a first landing pad; and a second pillar bump on the semiconductor device is bonded to a second landing pad. A channel forms with the active surface of the semiconductor device forming a first wall of the channel, the first pillar bump forms a second wall of the channel, the second pillar bump forming a third wall of the channel, and a surface of the first groove forms a fourth wall of the channel. The channel is filled with mold compound and at least a portion of the substrate and the semiconductor device are covered with mold compound.

17 Claims, 4 Drawing Sheets

SEMICONDUCTOR DEVICE PACKAGE WITH GROOVED SUBSTRATE

TECHNICAL FIELD

This disclosure relates generally to packaged semiconductor devices such as integrated circuits and discrete devices that are mounted on a substrate within a package.

SUMMARY

In a described example, a method for making a packaged semiconductor device includes laser ablating a first groove with a first width and a first depth into a mounting surface of a substrate between landing pads. A first pillar bump on an active surface of a semiconductor device is bonded to a first landing pad; and a second pillar bump on the semiconductor device is bonded to a second landing pad. A channel forms with the active surface of the semiconductor device forming a first wall of the channel, the first pillar bump forms a second wall of the channel, the second pillar bump forming a third wall of the channel, and a surface of the first groove forms a fourth wall of the channel. The channel is filled with mold compound and at least a portion of the substrate and the semiconductor device are covered with mold compound.

DETAILED DESCRIPTION

Figure 1:
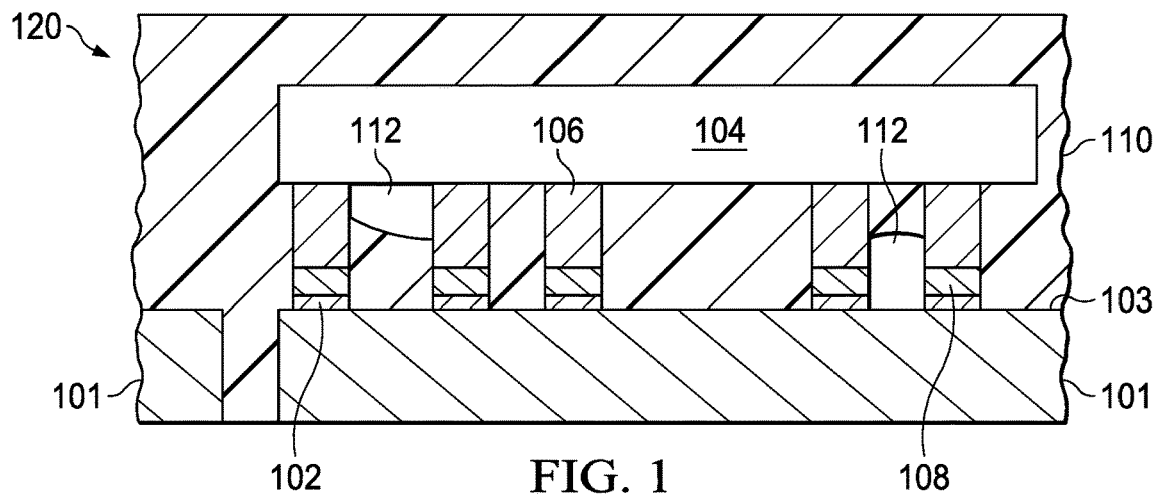
FIG. 1 is a cross section of a packaged semiconductor device with voids in mold compound.

Corresponding numerals and symbols in the different figures generally refer to corresponding parts, unless otherwise indicated. The figures are not necessarily drawn to scale.

The terms "encapsulated" and "encapsulates" are used herein to describe a packaged semiconductor device covered in a mold compound and the method for covering a semiconductor device in mold compound. As used herein, the term "encapsulated" means that while the semiconductor device and portions of a substrate are covered in mold compound, some portions of the substrate may be exposed from the mold compound to form external terminals of the packaged semiconductor device. The term "encapsulates" also means that the semiconductor device and portions of the substrate are covered in mold compound, however when the mold compound encapsulates a semiconductor device and a substrate, portions of the substrate remain uncovered to form external terminals of the packaged semiconductor device. A term commonly used for encapsulation in semiconductor packaging is "molding." Sometimes the term "potting" is also used to describe encapsulation. "Potting" as used herein means encapsulating a semiconductor device in mold compound, sometimes referred to as "potting compound." During a molding process, a substrate (for example, a lead frame) with a semiconductor device bonded to it is placed in an injection or transfer mold. Mold compound, such as epoxy resin, is injected into the mold to cover, encapsulate, or "pot" the semiconductor device and lead frame and form a packaged semiconductor device. A "semiconductor device" as used herein means a device fabricated using a semiconductor substrate. An example is an integrated circuit where one or more active devices, such as transistors, are formed in a single device and are coupled together with conductive material to perform a circuit function. However, a semiconductor device also includes discrete devices, such as a single transistor, a diode, a resistor, a capacitor or an inductor formed on a semiconductor substrate. Arrays of passive devices such as resistors or capacitors can also be formed as a semiconductor device, even when the device has no active devices.

In the arrangements the problem of voids in mold compound in packages including flip-chip mounted semiconductor devices is solved by the use of grooves formed between landing pads on a mounting surface of a substrate.

In example arrangements described and illustrated herein, a semiconductor device is mounted to a substrate. In the examples shown in the figures, the substrate is a lead frame. In alternative arrangements, useful substrates can include molded interconnect substrates or "MIS" substrates, premolded lead frames or "PMLFs" including conductors arranged in mold compound, printed circuit boards (PCBs), ceramic substrates, laminate materials including tapes and films, multilayer PCBs and laminates with layers of conductors spaced by insulating materials, or ceramic, resin, and fiberglass, or glass fiber reinforced epoxy substrates such as FR4. The substrates can include one or more redistribution layers (RDLs) that use conductors to map signals from one position to another position on the substrate. The substrate can include specified portions to receive a solder bump on a conductive pillar on a semiconductor device to be mounted to the substrate, which are referred to herein as "landing pads." The landing pads can be plated with materials used to increase solderability, such as thin layers of gold, nickel, palladium, and silver, or combinations of these. In alternative arrangements, the landing pads can be free from the solderability material platings but are conductive portions of the substrate that can receive solder.

FIG. 1 is a cross-sectional view of a packaged semiconductor device 120. A semiconductor device 104 is flip-chip mounted on a substrate 101, here 101 is a lead frame. In flip-chip mounting, a surface of a semiconductor device 104 where electronic devices such as transistors are formed, the surface referred to as the "active surface" or "face," is oriented to be positioned facing a mounting area on a surface of substrate 101, such as a lead frame. Because this mounting style is "face down" (when compared to a wire bonded package that carries the semiconductor device with the active surface oriented "face up"), the semiconductor device is referred to as "flipped" and the package is referred to as a "flip-chip" package. Conductive posts, solder balls, solder bumps, conductive studs or conductive pillar bumps couple bond pads on the active surface of the semiconductor device 104 to landing pads 102 on the substrate 101. When the pillar bumps are formed using copper, the term "copper pillar bumps" is used. Copper is a convenient material for semiconductor device packaging as it is low resistance, inexpensive, can be plated using electroplating or electroless plating, and is frequently used in semiconductor processes and is therefore readily available. In an alternative arrangement, a "face up" mounting, the semiconductor device 104 would be oriented with the active surface facing away from substrate 101, while bond wires form conductive connections between the bond pads on the semiconductor device and the landing pads 102 on substrate 101. Lead frames are manufactured using a conductive metal such as copper or brass or alloys such as Alloy-42 (an iron-nickel alloy used for lead frames), or another metal or conductive alloy. Mold compound 110 covers the semiconductor device 104 and portions of the substrate 101. Some portions of substrate 101 may remain uncovered by the mold compound 110. Exposed portions of conductive leads on the substrate 101 may form external terminals for the packaged device 120.

In the arrangement of FIG. 1, pillar bumps 106 formed on semiconductor device 104 have solder on an end away from the semiconductor device and are used to electrically connect and physically mount the semiconductor device 104 to a mounting area 103 of one surface of the substrate 101. The pillar bumps 106 enable a reduction in the size of the packaged device 120 and provide an improved electrical connection (when compared to a semiconductor device package using bond wire connections). The larger diameter and shorter length of the pillar bumps 106 (compared to bond wires) significantly reduces series resistance between the semiconductor device 104 and the substrate 101. Further, because pillar bumps 106 are arranged within the inside border of the area of the semiconductor device 104, the total board area for the packaged device 120 is somewhat reduced (when compared to a wire bonded package, where additional substrate area may be needed for the wire bond connections to leads to be made outside of the periphery of the semiconductor device, increasing the substrate area needed for the package).

Landing pads 102 of a solderable material such as silver, gold, nickel, palladium, copper or combinations of these can be formed on the mounting surface 103 to facilitate the formation of solder bonds 108 between pillar bumps 106 and the landing pad 102. Platings that enhance solderability and that can be used on the landing pads 102 also include electroless nickel immersion gold (ENIG) and electroless nickel, electroless palladium, immersion gold (ENEPIG) plated materials, silver, nickel and gold platings or combinations of these. The solder used on the pillar bumps 106 that forms solder joints 108 can be a lead (Pb) free solder such as tin-silver (SnAg or SA), tin-copper and tin-silver-copper (SnAgCu or SAC) compositions. Some of these compositions are eutectic or near-eutectic solders. Lead containing solder can also be used in the arrangements, although it is currently being replaced by the lead-free solder compositions.

As sizes of packages such as package 120 are continuously reduced, the spacing between the pillar bumps 106 and the length of the pillar bumps 106 (length is measured extending away from the active surface of semiconductor device 104) become smaller. This size reduction also reduces the size of the openings or channels formed between an active surface of semiconductor device 104 and the substrate 101 when the semiconductor device 104 is flip-chip bonded to the substrate 101. The mounting surface 103 of the substrate 101 forms one wall of a channel, the sides of pillar bumps 106 form second and third walls of the channel, and the active surface of the semiconductor device 104 forms a fourth wall of the channel. Smaller channels are difficult to fill with mold compound 110 during injection molding without forming voids (voids 112 are shown in FIG. 1). Voids 112 can cause reliability failure of the packaged semiconductor device 120 during later use.

Fillers are used in epoxy resin mold compound to increase thermal performance, add mechanical strength, and reduce cost. The diameter of filler particles currently used in mold compounds is about 55 μm. Channels with a width that is less than about 10 μm larger than the maximum diameter of filler particles are difficult to fill during molding without forming voids.

Figure 2:
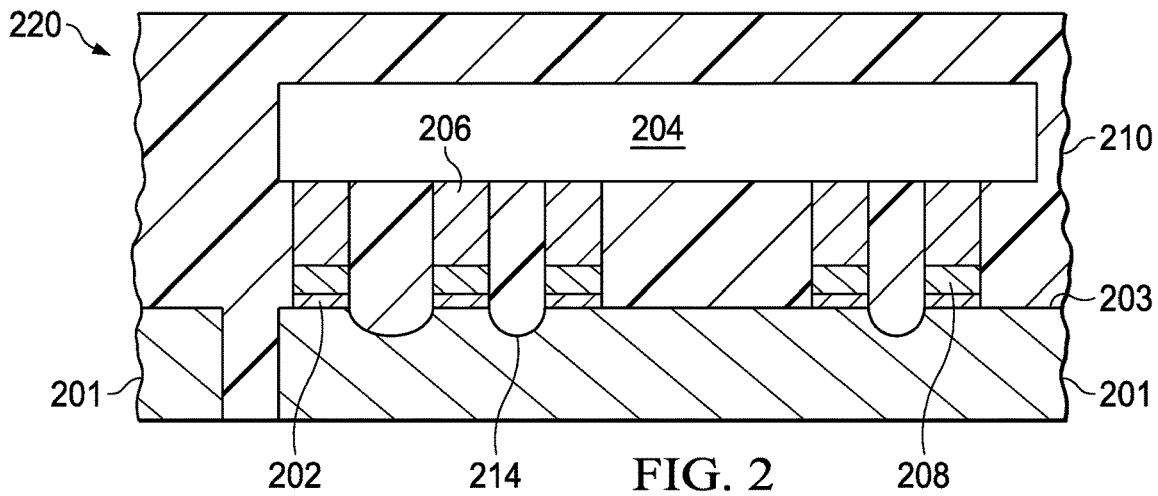
FIG. 2 is a cross section of a packaged semiconductor device with a substrate with grooves.

FIG. 2 is a cross sectional view of an arrangement for a packaged semiconductor device 220. In FIG. 2 similar reference labels are used for similar elements shown in FIG. 1, for clarity. For example, packaged device 220 in FIG. 2 corresponds to packaged device 120 in FIG. 1. FIG. 2 shows a packaged device 220 with a grooved lead frame as the substrate 201. Other substrate types could be used. Grooves 214 in the substrate 201 between the landing pads 202 on the mounting surface 203 increase the size of the channels between the semiconductor device 204 and the substrate 201, facilitating the ability of the mold compound 210 to flow into the channels and to fill the channels void free during the molding process. The channels have channel walls formed by the grooves in the substrate, the pillar bumps, and the semiconductor device. A first wall of the channel is formed by the groove 214 in the mounting surface 203 of the substrate 201. Second and third walls of the channel are formed by the solder joints 208 and the pillar bumps 206 that electrically connect the semiconductor device 204 to the substrate 201. An additional fourth wall of the channel is formed by the active surface of the semiconductor device 204 that the pillar bumps 206 extend from. In an example arrangement the channels are at least 15 ums larger than the largest diameter of filler particles in the mold compound to avoid void formation.

Laser ablation is capable of forming grooves with any width and depth in a substrate, such as a metal lead frame. To keep cost down, some grooves can also be formed during the initial substrate manufacture. For example, in a lead frame substrate, etching or stamping can be used to form some grooves while the substrate is being manufactured. For grooves of less than about 100 μm, lasers are used in the arrangements. In an alternative arrangement, the grooves can be formed in a follow-on process after substrate manufacture but prior to semiconductor device mounting. Grooves with widths of about 100 μm or more can formed using etch or stamping operations on the substrate. Grooves with widths less than about 100 μm can be formed using laser ablation.

In an example arrangement, the maximum filler particle size in mold compound is about 55 μm. For a package arrangement using this mold compound a minimum groove depth of 25 μm or more and a groove width of 65 μm or more are desired. The depth and width of the groove is not limited by the capability of the laser tool. Deeper and wider grooves formed using a laser require more time to form and are therefore more costly to manufacture. In example arrangements, the depth of grooves is between about 25 μm and 50 μm. In example arrangements, the width of grooves is between about 65 μm and 100 μm.

In an example arrangement, grooves 214 with a width of 65 μm and depth of 30 μm are formed in the mounting surface 203 of the substrate 201 using laser ablation. In an example, the substrate 201 is a copper lead frame. Other conductive lead frame materials can be used. In an example process, a 12 W laser with a 250 kHz repetition rate is used to form the grooves with a scan speed of 100 mm/s. Other process parameters can be used.

Figure 3A:
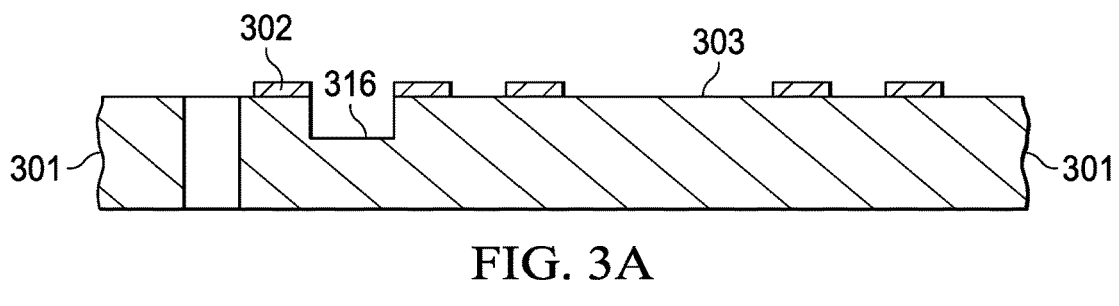
FIGS. 3A and 3B are cross sections of a lead frame prior to and post laser grooving.
Figure 3B:
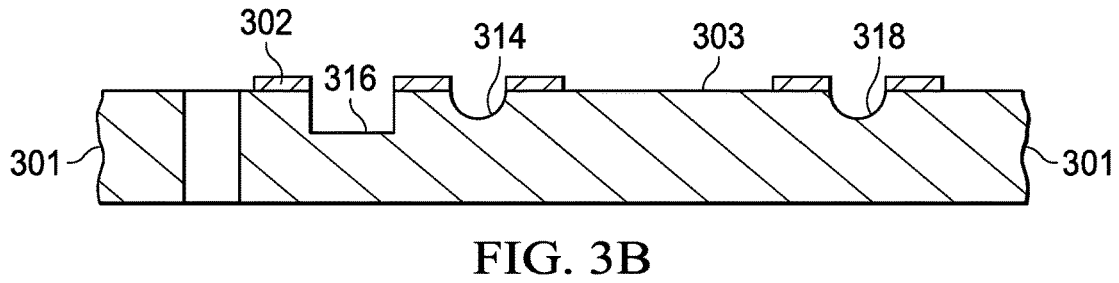

FIGS. 3A and 3B are cross-sectional views of lead frames for use as substrates in the arrangements. In FIGS. 3A and 3B similar reference labels are used for similar elements shown in FIG. 2, for clarity. For example, substrate 301 in FIG. 3A corresponds to substrate 201 in FIG. 2. FIG. 3A shows a substrate 301, here a lead frame, with a groove 316 that is formed using stamping or etching during the initial lead frame manufacture between two landing pads 302 in the mounting surface 303 of the substrate 301. Lead frame manufacturing equipment is currently limited to the formation of etched grooves 316 with a width of about 100 μm or greater. Grooves such as 314 (see FIG. 3B) with a width less than 100 μm can be formed using laser ablation of the substrate 301 metal.

FIG. 3B shows substrate 301 with a groove 316 made by etching or stamping during manufacture of the substrate and with additional grooves 314 formed using laser ablation. The grooves 314 can be formed with the same width as the groove 316 or can be formed with a different width than the groove 316. The groove 314 can be formed with a width that is narrower than the width of groove 316 formed by etching or stamping.

The grooves 314 in the example shown in FIG. 3B have a semicircular shape with the center portion of the grooves 314 and 318 deeper than the edges of the groove 314 and 318 formed by laser ablation. Grooves with various shapes can be formed using laser tools. For example, grooves 314 with an open rectangular shape having vertical or sloped straight sidewalls and a straight bottom wall can also be formed. "Straight" means the sidewalls and bottom walls of the groove have a surface in a line extending in one direction that connects two points; but the term "straight" as used herein includes a surface intended to be straight but including allowance for variations that arise during manufacturing. In another alternative arrangement, the grooves have sloped sidewalls that intersect at the bottom of the groove to make "V" shaped grooves. In still further alternatives, the grooves can have straight sidewalls and a rounded bottom shape.

Figure 4:
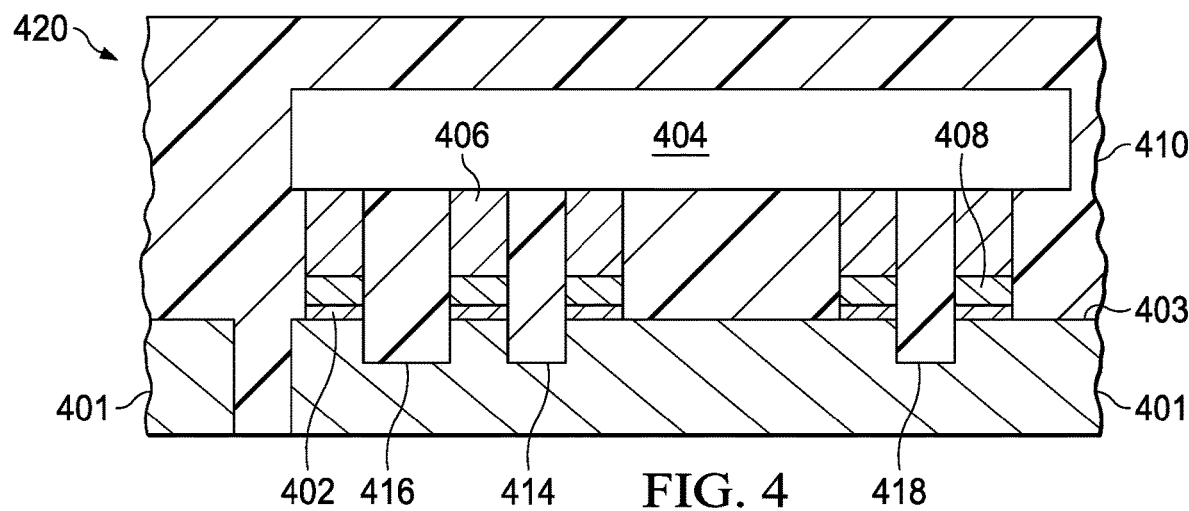
FIG. 4 is a cross section of a packaged semiconductor device with a grooved lead frame.

FIG. 4 is a cross-sectional view of another packaged semiconductor device arrangement 420. In FIG. 4 similar reference labels are used for similar elements as the elements shown in FIG. 2, for clarity. For example, packaged semiconductor device 420 in FIG. 4 corresponds to packaged semiconductor device 220 in FIG. 2. FIG. 4 shows grooves 414 and 418 formed by lasers in the mounting surface 403 of substrate 401. In this arrangement the grooves 414 and 418 have an open rectangular shape (a rectangle with one side missing) with substantially straight and vertical sidewalls (as the packaged semiconductor device 420 is oriented in FIG. 4) and with a substantially straight and horizontal bottom wall. In this example, grooves 414 and 418 are the same depth, but in alternative arrangements, these grooves could be formed with different depths. Narrow and wide grooves formed by laser tools can have the same depth or different depths. Wide grooves need not be as deep as narrow grooves for the channel formed by the sidewalls, bottom and the surface of the semiconductor device to fill void free during molding. For ease of processing, grooves formed using a laser tool with different widths and having the same depth are preferred. Semiconductor device 404 has pillars 406 with solder joints 408 connecting the pillars 406 to the landing pads 402. Mold compound 410 covers the semiconductor device 404, the pillars 406, solder joint 408, and a portion of substrate 401 on surface 403.

Figure 5:
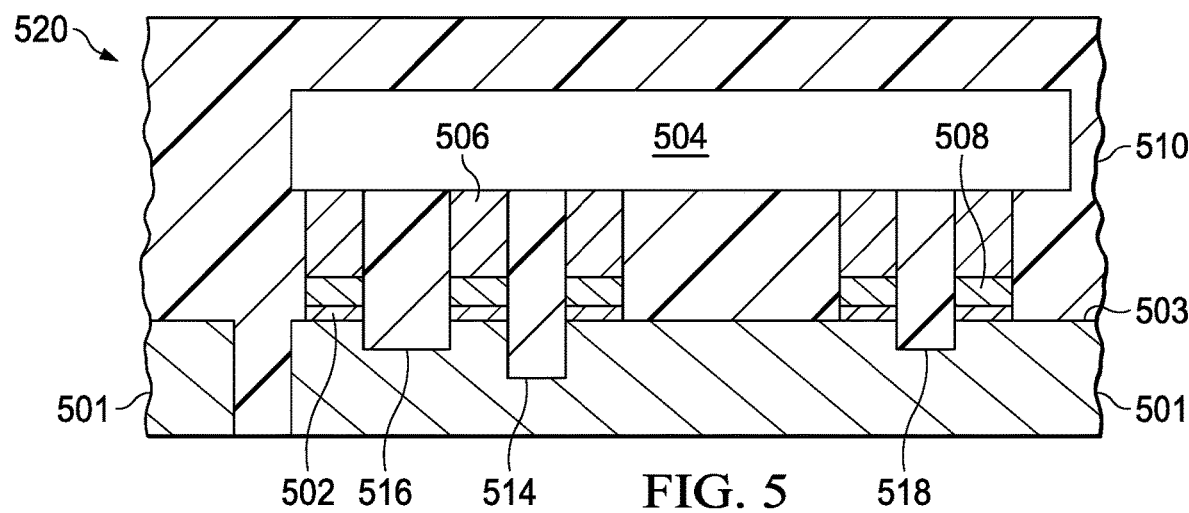
FIG. 5 is a cross section of a packaged semiconductor device with a grooved lead frame.

FIG. 5 is a cross sectional view of another example packaged semiconductor device 520. In FIG. 5 similar reference labels are used for similar elements shown in FIG. 2, for clarity. For example, packaged semiconductor device 520 in FIG. 5 corresponds to packaged semiconductor device 220 in FIG. 2. In FIG. 5, the semiconductor device 504 has pillar bumps 506 formed on an active surface and extending away from the active surface, solder joints 508 are formed on landing pads 502 of the substrate 501, the semiconductor device 504 is mounted to a mounting surface 503, and mold compound 510 covers at least a portion of substrate 501.

As shown in FIG. 5 grooves 514 and 518 are formed using laser ablation in the mounting surface 503 of the substrate 501. Grooves 514 and 518 have an open rectangle shape (rectangle with one side missing) with substantially straight and vertical sidewalls (as oriented in FIG. 5) and a substantially straight and horizontal bottom. Grooves 514 and 518 have different depths. The narrower groove 514 is deeper than the wider groove 518 to better facilitate flow of the mold compound 510 during encapsulation or molding. Although the different width grooves, 514 and 518, have different depths in this arrangement, for ease of processing using a laser tool, different width grooves with the same depth are preferred, or same width grooves with the same depth, to allow a single depth setting for the laser tool.

Laser ablation can be used to form the grooves, 514 and 518, on the mounting surface 503 of a substrate 501 to enlarge the channels through which mold compound 510 flows when the semiconductor device 504 and substrate 501 are encapsulated with mold compound 510. Current lead frame tooling limits the formation of grooves 516 during stamping or etching of a lead frame to a width greater than about 100 μm during the initial lead frame manufacture. In the arrangements, grooves with a width less than about 100 μm can be later added using laser ablation. The grooves 514 and 518 increase the volume of the channels through which mold compound 510 flows during molding, enabling smaller packaged devices to be formed with no voids in the mold compound such as 510. This improves reliability of the packaged semiconductor device 520.

Figure 6:
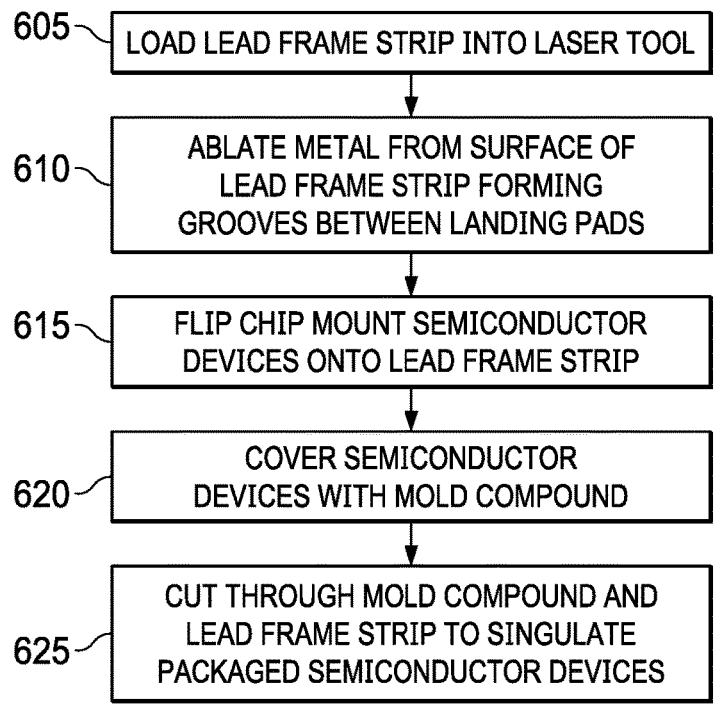
FIG. 6 is a flow diagram listing the steps for making a packaged semiconductor device with a grooved lead frame using a laser.

FIG. 6 is a flow diagram describing the steps in a method for forming a packaged semiconductor device. FIGS. 7A-7D illustrate in cross sections the major manufacturing steps for an example packaged semiconductor device 704 that is mounted on a lead frame substrate 701 and the formation of grooves 714 and 718 in the mounting surface 703 of the substrate 701 using a laser tool. In this example method of FIG. 6 and in the cross sections of FIGS. 7A-7D, substrate 701 is a lead frame.

Returning to FIG. 6, in step 605 lead frames on a lead frame strip are loaded into a laser grooving tool. A lead frame strip is an array of individual lead frames joined together by material in saw streets. After a semiconductor device 704 is mounted on each individual lead frame 701 in a lead frame strip, the lead frames are encapsulated or partially covered in mold compound 710. A saw (or laser) is used to cut through the mold compound 710 and the lead frame strip in saw streets between the individual lead frames 701 to singulate individual packaged semiconductor devices 720. FIGS. 7A-7D show the manufacturing steps for an individual lead frame 701. (The lead frame strip comprised of multiple lead frames 701 connected together is not shown, for simplicity.)

Figure 7A:
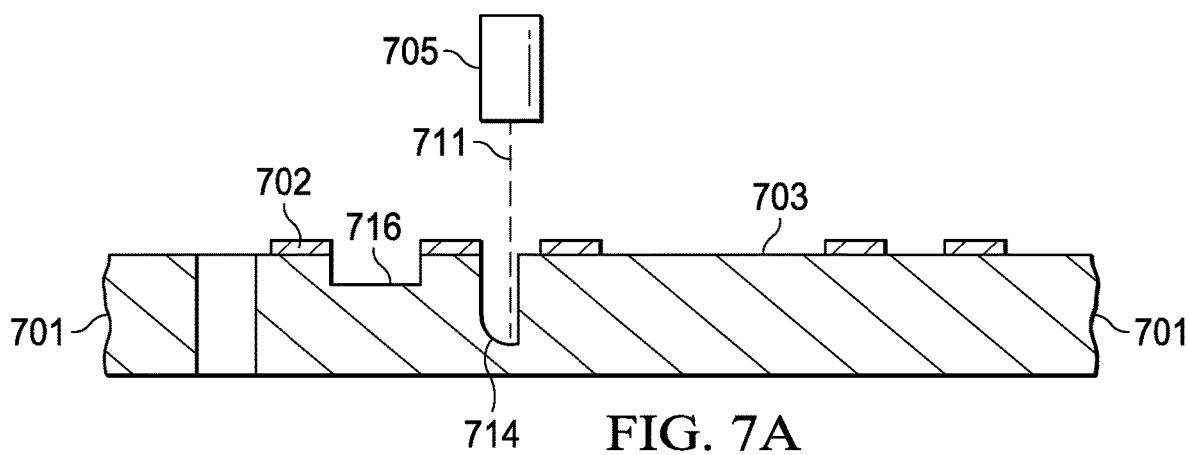
FIGS. 7A-7D are cross sections depicting major steps for making a packaged semiconductor device using a laser tool for forming a grooved lead frame.
Figure 7B:
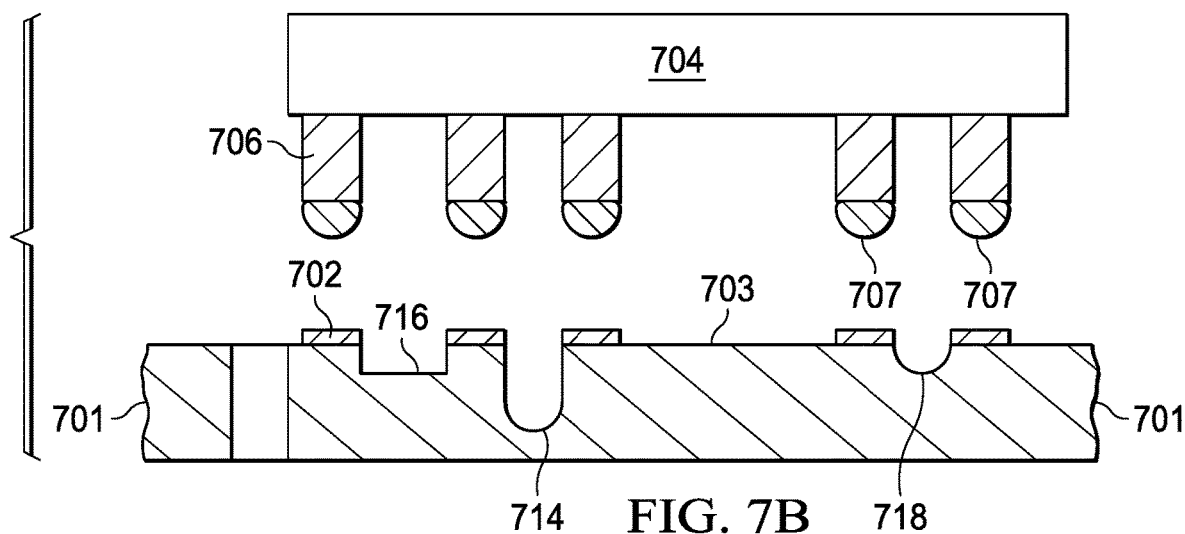
Figure 7C:
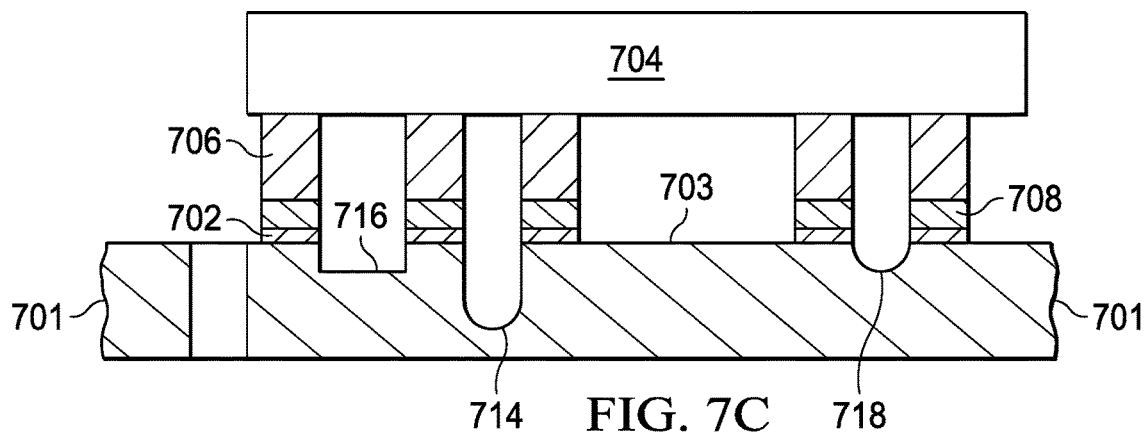
Figure 7D:
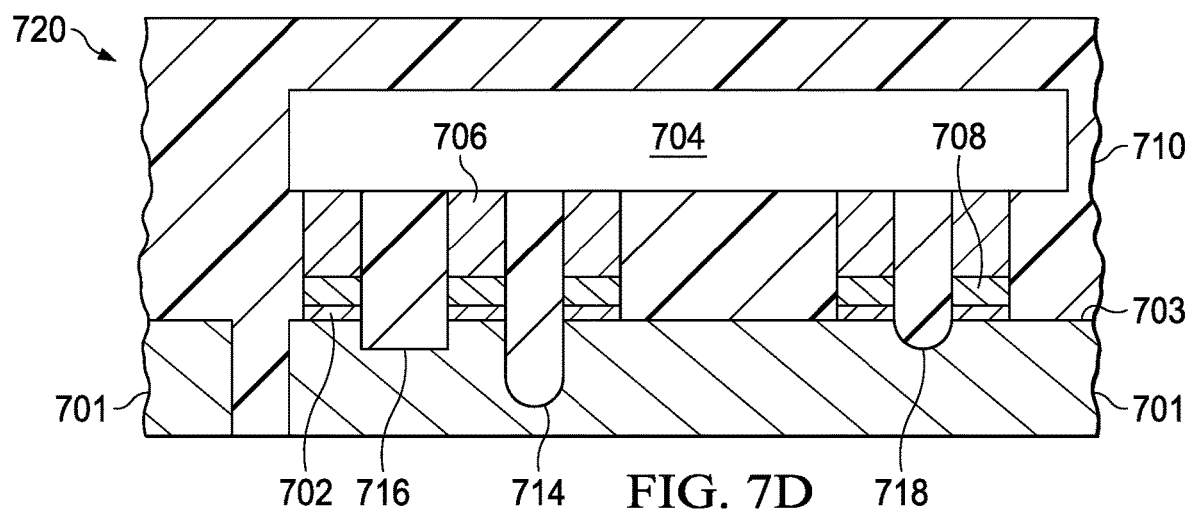

In step 610 (depicted in FIGS. 7A and 7B) a laser beam 711 from a laser 705 ablates material from the mounting surface 703 of the lead frames such as 701 on the lead frame strip to form grooves 714. Grooves 714 can have a width of less than 100 ums. Wider groove 716 can be formed using etch or stamp operations during the manufacture of the lead frame 701. FIG. 7A shows a narrow, deep groove 714 being formed in the mounting surface 703 of the lead frame 701 using laser ablation. In an example application the groove 714 is about 65 µm wide and about 50 µm deep. FIG. 7B shows the lead frame 701 with the narrow, deep groove 714 and a wider, shallower groove 718. Grooves 714 and 718 can be formed in a laser tool with the same depth or the wider grooves 718 can be formed with a shallower depth. For ease of processing in the laser tool, grooves with the same depth are preferred. Using the same depth setting on the laser tool requires less time than the time needed for multiple depth settings.

FIG. 7B also shows the semiconductor device 704 with pillars 706 topped with solder bumps 707 in an orientation with the active surface of semiconductor device 704 facing the mounting surface 703 of the lead frames in a lead frame strip such as 701 prior to flip-chip bonding. The solder bumps 707 at the ends of pillars 706 are positioned over landing pads 702 on the mounting surface 703 of the lead frame 701.

In step 615 (depicted in FIG. 7C) semiconductor device 704 is flip-chip bonded to the lead frame 701. Each of the lead frames such as 701 in the lead frame strip will have a semiconductor device mounted to it. During a thermal reflow process, solder bumps 707 (see FIG. 7B) at the ends of the pillars 706 melt forming solder bonds 708 between the pillars 706 on the semiconductor device 704 and the landing pads 702 on the mounting surface 703 of the lead frame 701 (see solder joints 708 in FIG. 7C). The groove 716 and the grooves 714 and 718 formed using the laser tool enlarge the channels through which the mold compound 710 will flow during encapsulation or molding.

In step 620 (depicted in FIG. 7D) the flip-chip bonded semiconductor device 704 and the lead frame 701 are covered in mold compound 710. The grooves in the substrate including 712, 714, 718, along with the pillar bumps and the active surface of the semiconductor device, form enlarged channels that enable mold compound 710 to flow more readily during the encapsulation or molding process, filling the channels without forming voids. In one arrangement, a block molding process is used. In another arrangement, a transfer mold with mold chases forming a shaped package around each individual semiconductor device is used to form packaged devices connected by lead frame material from the lead frame strip.

In step 625, the packaged semiconductor devices 720 are singulated (separated from one another) by laser or mechanical sawing through the mold compound 710 and sawing through the lead frame strip in saw streets (not shown in the figures, for simplicity of illustration) that are part of the lead frame strip between the individual lead frames 701.

Modifications are possible in the described arrangements, and other alternative arrangements are possible within the scope of the claims.

What is claimed is:

1. A packaged semiconductor device, comprising:
    a substrate having a mounting surface and having an opposing surface, and having a first landing pad spaced from a second landing pad on the mounting surface;
    a first groove having a first width of less than 100 microns in the mounting surface and having a first depth, the first groove between the first landing pad and the second landing pad;
    a first pillar bump on an active surface of a semiconductor device bonded to the first landing pad;
    a second pillar bump on the semiconductor device bonded to the second landing pad;
    mold compound covering the semiconductor device and a portion of the substrate; and
    a channel having channel walls formed by the first groove in the mounting surface of the substrate, sides of the first and second pillar bumps, and the active surface of the semiconductor device, the channel filled with the mold compound.

2. The packaged semiconductor device of claim 1, wherein the first depth is less than the first width.

3. The packaged semiconductor device of claim 1, wherein the first width of the first groove is less than about 80 µm.

4. The packaged semiconductor device of claim 1, wherein the first depth is greater than or equal to 25 µm.

5. The packaged semiconductor device of claim 1, wherein the first depth is in a range of 25 µm to 50 µm.

6. The packaged semiconductor device of claim 1, further including additional grooves in the mounting surface of the substrate, wherein the additional grooves have a width that is greater than or equal to 100 microns.

7. The packaged semiconductor device of claim 1, and further including at least a second groove in the mounting surface of the substrate between a third landing pad and a fourth landing pad on the mounting surface, the second groove with a second width less than 100 microns and having a second depth.

8. The packaged semiconductor device of claim 7, wherein the second width is the same as the first width and wherein the second depth is the same as the first depth.

9. The packaged semiconductor device of claim 7, wherein the second width is greater than the first width and wherein the second depth is the same as the first depth.

10. The packaged semiconductor device of claim 7, wherein the second width is wider than the first width and wherein the second depth is less than the first depth.

11. The packaged semiconductor device of claim 7, wherein the second width is the same as the first width and wherein the second depth is less than the first depth.

12. The packaged semiconductor device of claim 1, wherein the mold compound filling the channel is free of voids.

13. The packaged semiconductor device of claim 12, wherein a minimum width of the first groove is at least 10 µm larger than a maximum diameter of filler particles in the mold compound.

14. The packaged semiconductor device of claim 1, wherein the first groove has a curved semicircular shape.

15. The packaged semiconductor device of claim 1, wherein the first groove has an open rectangle shape with one open side and with three additional sides having three substantially straight walls.

16. The packaged semiconductor device of claim 1, wherein the substrate is a metal lead frame.

17. The packaged semiconductor device of claim 16, wherein the metal lead frame is one selected from a group consisting essentially of copper, brass, copper alloys and Alloy-42.

* * * * *